United States Patent

Ishikawa et al.

[11] Patent Number: 6,042,646
[45] Date of Patent: Mar. 28, 2000

[54] SIMPLE METHOD FOR DETECTING TEMPERATURE DISTRIBUTIONS IN SINGLE CRYSTALS AND METHOD FOR MANUFACTURING SILICON SINGLE CRYSTALS BY EMPLOYING THE SIMPLE METHOD

[75] Inventors: Fumitaka Ishikawa; Toshiaki Saishoji; Kozo Nakamura, all of Kanagawa, Japan

[73] Assignee: Komatsu Electric Metals Co., Ltd., Kanagawa, Japan

[21] Appl. No.: 09/015,515

[22] Filed: Jan. 29, 1998

[30] Foreign Application Priority Data

Jan. 29, 1997 [JP] Japan ................................. 9-028261

[51] Int. Cl.$^7$ ................................................. C30B 15/20
[52] U.S. Cl. ........................ 117/14; 117/201; 117/202
[58] Field of Search ........................ 117/14, 15, 201, 117/202

[56] References Cited

U.S. PATENT DOCUMENTS 4,981,549  1/1991  Yamashita et al. ........................ 117/3
5,853,480  12/1998  Kubota et al. ........................ 117/217

Primary Examiner—Felisa Hiteshew
Attorney, Agent, or Firm—Sughrue, Mion, Zinn, Macpeak & Seas, PLLC

[57] ABSTRACT

A single crystal is pulled to a length at which the beginning of the body of the single crystal is assumed sufficiently to have been cooled down to a temperature below 1000° C.; then the single crystal being pulled is detached from the molten silicon by pulling it at a speed high enough to cut it out from the molten silicon. Then oxygen precipitation heat-treatment is performed on the single crystal to locate the portion of AOP. AOP arises at the boundary of grown-in defects being formed zone while the single crystal passes through 1100° C., and the position is at about 1100° C. immediately before, detaching the single crystal out from the molten silicon. Therefore, the position at temperature 1100° C. in the single crystal immediately before detaching the single crystal out from the molten silicon are known, then the temperature distributions of the single crystal immediately before detaching it out from the molten silicon can be decided easily. If the speed at which the temperature range near 1100° C. is passed through is controlled, then the occurrence of the defects while growing the single crystal can be controlled.

6 Claims, 3 Drawing Sheets

CRYSTAL COOLING RATE (°C/min)

○ : OBTAINED BY ACTUALLY MEASURED TEMPERATURE BY THERMALCOUPLER

● : OBTAINED BY METHOD OF THE INVENTION 6,042,646

SIMPLE METHOD FOR DETECTING TEMPERATURE DISTRIBUTIONS IN SINGLE CRYSTALS AND METHOD FOR MANUFACTURING SILICON SINGLE CRYSTALS BY EMPLOYING THE SIMPLE METHOD

BACKGROUND OF THE INVENTION

1. Field of the Invention

This invention relates to a simple method for detecting temperature distributions in single crystals and a method for manufacturing silicon single crystals by employing the simple method. More specifically, this invention relates to a simple method for detecting temperature distributions in single crystals within a furnace of single-crystal manufacturing apparatus, in which grown-in defects are required to be controlled, and relates a method for manufacturing silicon single crystals by employing the simple method. The density and characteristics of the grown-in defects are depending on the heat history of the single crystals produced.

2. Description of the Related Art

The substrates of semiconductor components are mainly composed of a high-purity silicon single crystal that is generally produced by the CZ method. In the CZ method, polycrystalline silicon nuggets are fed into a crucible of a semiconductor single-crystal manufacturing apparatus. Then the quartz crucible is heated by cylindrical heaters disposed therearound to melt the polycrystalline silicon lumps, after which a seed crystal installed on a seed chuck is dipped into the molten silicon. After that, the seed chuck and the quartz crucible are respectively driven to rotate in opposite or identical directions, and at the same time the seed chuck is pulled to grow a single-crystal silicon ingot of predetermined diameter and length.

In recent years, with the microminiaturization and the high-density accumulation of the device structures, gate oxide film integrity has become a more important characteristic. The deterioration of the gate oxide film integrity of LSI is caused by grown-in defects, which are formed in silicon single crystals during the crystal growth. It is found that the grown-in defects include LSTD (Laser Scattering Tomography Defects), FPD (Flow Pattern Defects), and COP (Crystal Originated Particle), and it is known that there exists a distinct relationship between the density of the grown-in defects and B-mode failure ratio with respect to gate oxide film integrity.

Grown-in defects are formed in a solidified silicon single crystal during the process of growing it from the molten silicon, at a temperature near 1100° C., specifically, when it passes a temperature range from 1150° C. to 1080° C. It has been established that density of grown-in defects can be reduced if the cooling rate of the single crystal is reduced when the crystal passes through the above temperature range, and if this is achieved then oxidation-film voltage endurance can be enhanced. The cooling rate in this temperature range is a factor for determining the density or the size of Grown-in defects. Accordingly, it is known that the cooling rate is controlled so that the density or the size of Grown-in defect can be changed desirably. Alternatively, it is known that if a single crystal is cooled down rapidly and oxygen precipitation heat treatment is exerted on the single crystal, then AOP (Anomalous Oxygen Precipitate) can be found in specified portions of the single crystal. Therefore, it is very useful to the industry that; if a location where its interior temperature approaches 1100° C. and the cooling rate of a single crystal being pull passing the location thereof are recognized; and then those are used to control the grow-in defect.

The cooling rate of a silicon single crystal being grown is determined by the pulling speed and the temperature distributions in the silicon single crystal (the temperature gradient in the interior of the silicon single crystal). The pulling speed is preset and known and only the temperature distributions in the silicon single crystal need to be calculated. Computer-aided simulation and temperature detection with the aid of thermal couples are also available to ascertain the temperature distributions in a silicon single crystal.

In the process of computer-aided simulation, calculation has to be carried out by simplifying the interior structure of the furnace to some extent, and this will lead to some problems to precision of calculation. Furthermore, when directly detecting the interior temperature of a crystal, it is necessary to prepare thermal couples and a dummy crystal instead of the single crystal to be grown. It is also necessary to choose thermal couples made of high-temperature endurance materials, such as platinum—platinum-rhodium, and the thermal couples has to be sheathed with quartz tubes to enable them to be insulated from the dummy crystal into which the thermal couples are embedded. The thermal couples and the quartz tubes are very expensive and sheathing the thermal couples is a time-consuming process. Usually, a silicon single crystal pulled according to the CZ method is used as a dummy crystal, and holes have to be drilled thereon. In the process of drilling, the dummy crystal is very brittle, and precision is required with this technique.

Furthermore, it is required to connect the thermal couples with a voltmeter disposed outside the furnace. Therefore, the dummy crystal can not be rotated like the single crystals being pulled. Otherwise, it will be impossible for temperature distributions to be detected precisely. Furthermore, wiring of the thermal couples will restrain the upward or downward movements of the dummy crystal, and the movement of the dummy crystal may rupture the wires.

SUMMARY OF THE INVENTION

In light of the above drawbacks, the object of the present invention is to provide a simple method for detecting temperature distributions in single crystals and a method for manufacturing silicon single crystals by employing the simple method. According to this invention, temperature distributions in a single crystals being grown by the CZ method within single-crystal manufacturing apparatus, especially the position with a temperature near 1100° C. where grown-in defects be formed, can be easily detected. Moreover, according to the manufacturing method of this invention, the position at a temperature near 1100° C. are detected to produce single crystals with desirable crystal defects.

To accomplish the above object, according to this invention, in the method for detecting temperature distributions in single crystals being grown in the process of manufacturing silicon single crystals by the CZ method: a single crystal is pulled to a length at which the beginning of the body of the single crystal assumed is sufficiently to have been cooled down to a temperature below 1000° C.; then the single crystal being pulled is detached from the molten silicon by pulling it at a speed high enough to detach from the molten silicon; oxygen precipitation heat-treatment is performed on the detached single crystal to locate the portion of AOP so as to detect the position that are at temperature 1100° C. in the single crystal immediately before detaching the single crystal from the molten silicon; and the temperature distributions, before detaching the single crystal out from the molten silicon, in the single crystal can be simply detected.

According to the above method, if the single crystal is pulled in the furnace at actual conditions and an oxygen precipitation heat-treatment is performed on the detached single crystal to locate the portion of AOP, then the temperature distributions from the molten silicon to the position at temperature 1100° C. in the single crystal can be easily detected. Furthermore, only quite a short time is required for the above detecting operation, and it can be performed at low cost.

According to this invention, in a method for producing silicon single crystal employing the simple method for detecting the temperature distributions in the single crystals and controlling the manufacturing conditions such as the interior temperature of the furnace and the pulling ratio in the process of manufacturing silicon single crystals by the CZ method: a single crystal is pulled to a length at which the beginning of the body of the single crystal is assumed sufficiently to have been cooled down to a temperature below 1000° C.; then the single crystal being grown is detached from the molten silicon by pulling it at a speed high enough to detach it from the molten silicon; oxygen precipitation heat-treatment is performed on the detached single crystal to locate the portion of AOP so as to detect the position at temperature 1100° C. in the single crystal immediately before detaching the single crystal from the molten silicon; and thereafter the cooling rate at a temperature range near 1100° C. is controlled so as to produce crystals with a desirable defect density.

According to the above method, if the single crystal is pulled in the furnace at actual conditions and an oxygen precipitation heat-treatment is performed on the detached single crystal to locate the portion of AOP, the temperature distributions from the molten silicon to the position at temperature 1100° C. in the single crystal can be detected. Accordingly, temperature distributions in the single crystal can be exactly detected. Therefore, the crystal pulling ratio is calculated and set based on the crystal cooling rate at 1100° C. capable of controlling desirably the density of Grown-in defect and the temperature gradient within crystal calculated by the crystal position at 1100° C. to thereby control the density of Grown-in defect. In particular, the temperature distributions from the molten silicon to the position at temperature 1100° C. in the single crystal can be detected in the same furnace under the same conditions, and the precision with which position are located can be enhanced by strictly controlling the process. Therefore, the manufacturing conditions can be kept unvaried and the formation of the defects can be controlled.

BRIEF DESCRIPTION OF THE DRAWINGS

The present invention can be more fully understood by reading the subsequent detailed description and examples with reference made to the accompanying drawings, wherein.

DETAILED DESCRIPTION OF THE INVENTION

Figure 1:
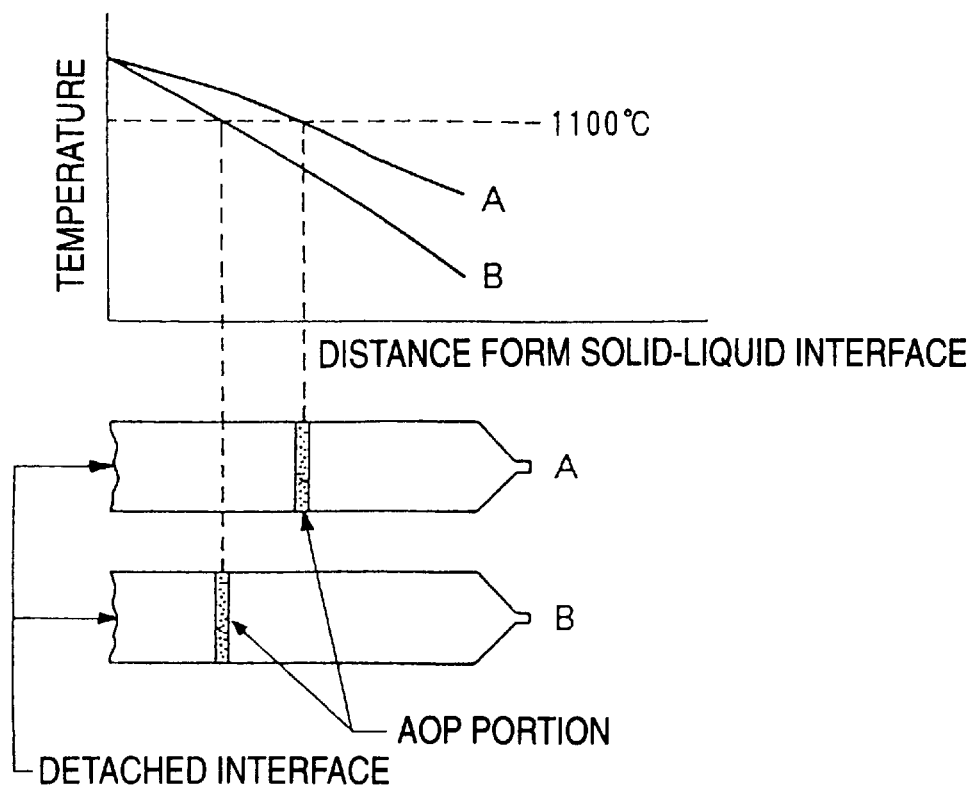
FIG. 1 is an illustration showing the comparison between the temperature distributions detected by thermal couples embedded in the body of the single crystal and the AOP portions located by the simple method for detecting temperature distributions in single crystals of this invention.

The following is a detailed description of a method for manufacturing silicon single crystals, according to this invention, with references being made to the accompanying drawings.

AOP is formed from oxygen precipitation with the aid of vacancies retained in the single crystals during crystal growth. The above oxygen precipitation is commonly precipitated in the form of a nucleus at temperatures ranging from 800° C. to 600° C. A grown-in defect is formed by aggregated vacancies that become supersaturated when a silicon single crystal is being pulled within a temperature range essentially ranging from 1150° C. to 1080° C. As it passes through the above temperature range, the higher the cooling rate, the higher the defect density becomes. The inventors of this invention noticed that if a single crystal being pulled is rapidly cooled, AOP will be formed at the boundary zone within which grown-in defects be formed, and the above phenomenon clearly and undeniably reappears within certain designated temperature ranges. This invention is designed to make use of the above phenomenon. According to this invention, a single crystal has been pulled to a required length; subsequently the pulling speed is raised to detach the single crystal out from the molten silicon. Then, an oxygen precipitation heat-treatment is performed on the detached single crystal to locate the portion of AOP. Therefore, it is easy to detect the position of the defect-forming temperature zone immediately before detaching the single crystal out from the molten silicon.

When employing the above method to various manufacturing apparatus having different structures, the position of AOP can be located in each different apparatus. Therefore, it is possible to control the formation of the grown-in defects in an actual process of manufacturing silicon crystals.

The following is a description, with reference made to the accompanying drawings, of an embodiment of the simple method for detecting temperature distributions in single crystals within single-crystal manufacturing apparatus. At first, a single crystal is pulled to a required length by the CZ method within a furnace where detection is carried out. The above-required length means an adequate length at which the beginning of the body of the single crystal is assumed to be at a position sufficiently to have been cooled down to a temperature below 1000° C. Specifically, it is enough to pull the body to a length close to 300 mm. Then, the seed chuck is pulled at a rapid speed (it means a speed high enough to cut the pulled single crystal out from the molten silicon, for example, 10 cm/min) to cut the lower end of the body out from the molten silicon. Next, the detached single crystal is pulled away from the molten silicon to cool down.

An oxygen precipitation heat-treatment is performed on a test piece detached from the single crystal produced following the above process to locate the AOP portion. The locating process is performed by the use of detecting methods, such as the X-ray topography or the FTIR method based on the difference of oxygen densities existing in the lattices prior to and subsequent to the heat-treatment. The AOP portion is considered the site in the crystal, at a temperature near 1100° C. immediately before detaching the single crystal from the molten silicon. In addition, the temperature of the detached interface between single crystal and melt should be 1412° C., the melting point of the silicon. Therefore, the temperature distributions of the single crystal immediately before detaching can be easily estimated.

FIG. 1 is an illustration showing the comparison between the temperature distributions detected by thermal couples embedded in the body of the single crystal and the AOP portions located by the simple method for detecting temperature distributions in single crystals of this invention. In addition, Table 1 shows the experiment results obtained by employing the method for detecting temperature distributions according to this invention. Two types of single crystals A and B produced by two separate furnaces, types A and B respectively, with different temperature distributions were prepared. As shown in FIG. 1, in the single crystals A and B, AOP (Anomalous Oxygen Precipitate) appeared at locations having a temperature 1100° C. immediately before detaching the single crystal out from the molten silicon.

As shown in Table 1, in the experiments performed by employing the method for detecting temperature distributions, the diameters of the crystals under analysis were 4 inches and 6 inches. In addition, the hot zones of the furnaces employed were A type whose heat shield is made of graphite only and B type whose heat shield is made of graphite fibers covered with graphite. In the case of diameter 4 inches, the body was pulled to a length of 450 mm, and then the body was detached from the molten silicon. In the case of diameter 6 inches, the body was pulled to a length of 350 mm, and then the body was detached from the molten silicon. In Table 1, data in columns illustrated by "pulling speed before detaching" and "oxygen concentration" is data taken from single crystals without thermal couples embedded therein. Data in columns illustrated by "cooling rate" and "temperature of AOP peak portion in crystal before detaching out", both of which are required in detecting the interior temperatures of crystals, is data taken from dummy crystals with thermal couples embedded therein.

Figure 2:
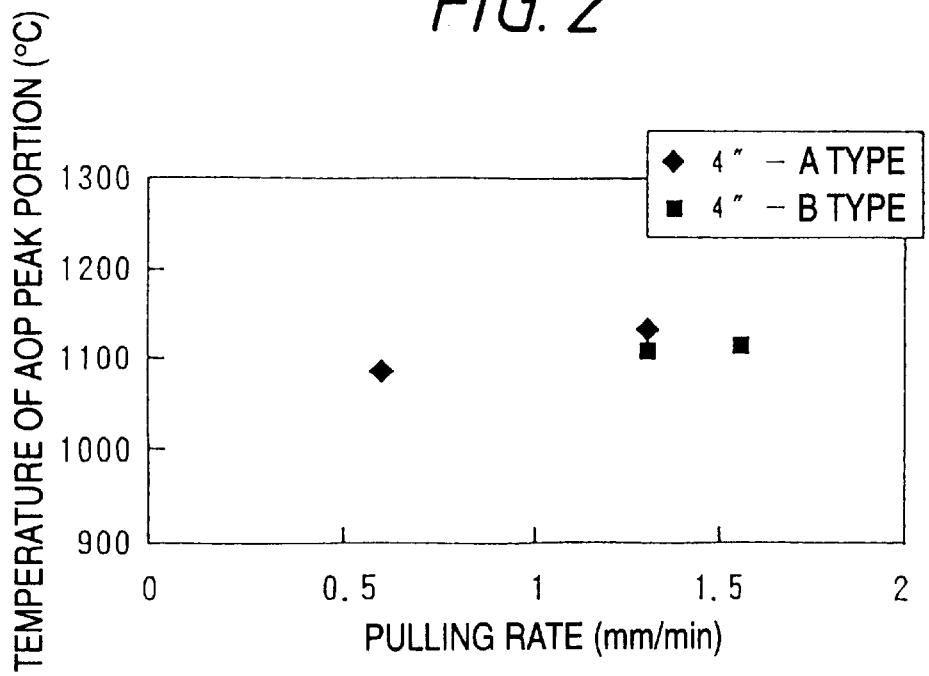
FIG. 2 is an illustration showing the relationship between the pulling rates and the locations of AOP, the locations are expressed by the temperatures of the single crystals immediately before detaching them from the molten silicon.
Figure 3:
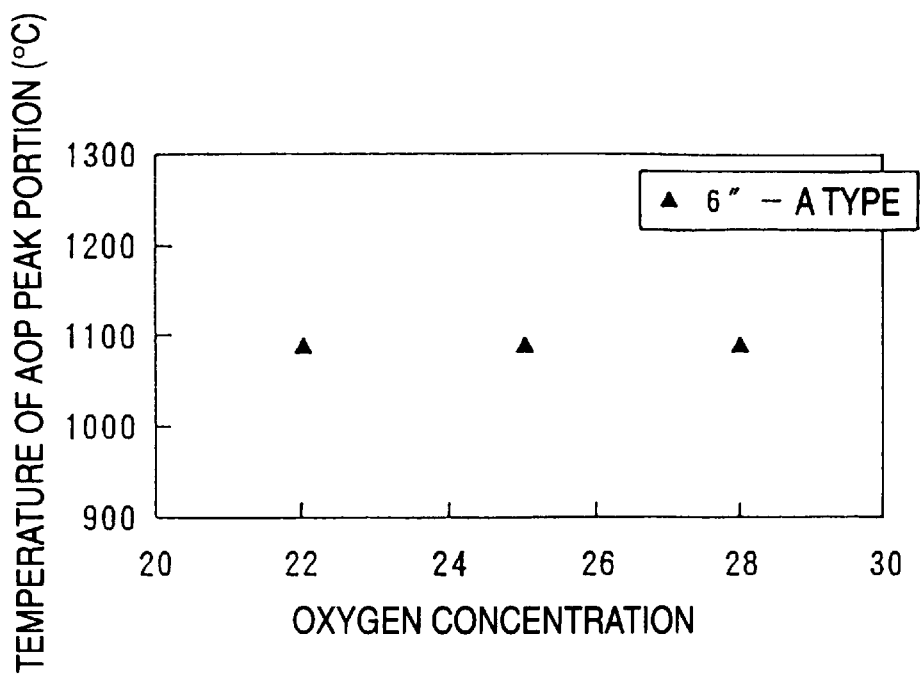
FIG. 3 is an illustration showing the relationship between the oxygen concentrations and the locations of AOP, the locations are expressed by the temperatures of the single crystals immediately before detaching them from the molten silicon.
Figure 4:
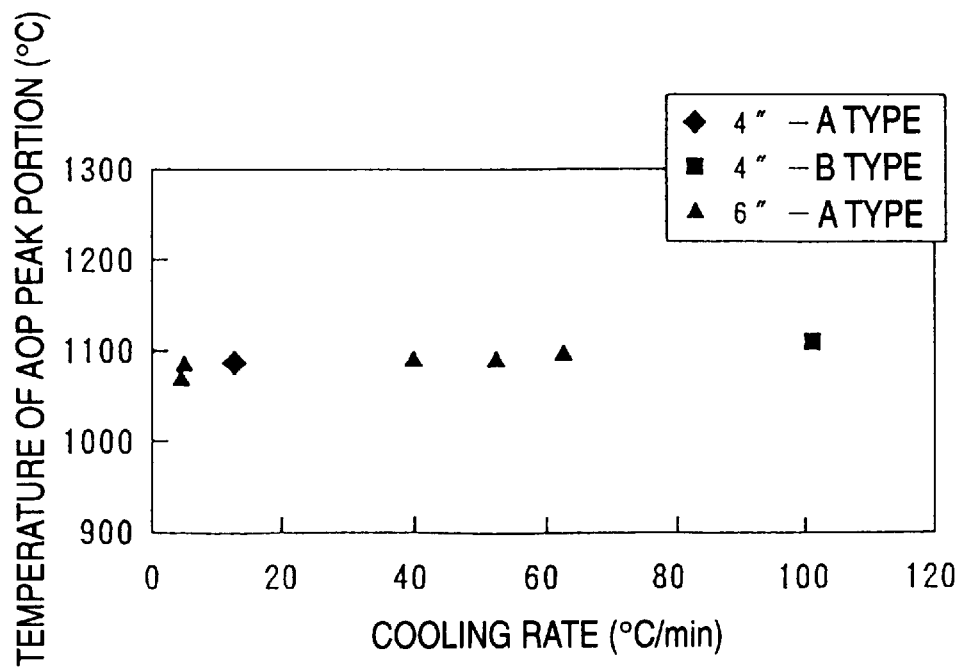
FIG. 4 is an illustration showing the relationship between the cooling rates and the locations of AOP, the locations are expressed by the temperatures of the single crystals immediately before they are detached from the molten silicon.

The results of the above experiments are shown in FIGS. 2 to 4. In FIG. 2, the vertical axis denotes the locations of AOP, expressed by the temperatures of the single crystals, immediately before detaching out from the molten silicon, and the horizontal axis denotes the pulling speeds immediately before detaching out from the molten silicon. For crystals of diameter 4 inches, regardless of whether A type furnace (whose heat sheild is made of graphite only) or B type furnace (whose heat sheild is made of graphite+ graphite fibers) were employed, AOP appeared at locations having a temperature near 1100° C. immediately prior to cutout . In FIG. 3, the vertical axis denotes the same as that of FIG. 2, and the horizontal axis denotes oxygen concentration. For crystals of diameter 6 inches, in the case of employing A type furnace, AOP appeared at locations having a temperature near 1100° C. immediately before detaching is irrelevant to the oxygen densities of the crystals. In addition, in FIG. 4, the vertical axis denotes the same as for FIG. 2, and the horizontal axis denotes the cooling rate required for cooling down the detached interface to a temperature below 1100° C. In FIG. 4, AOP also appeared at locations having a temperature near 1100° C. immediately before detaching is irrelevant to the diameter of the crystal, the type of the furnace, or the above-mentioned cooling rate. As described above, AOP appeared at locations having a temperature near 1100° C. immediately before detaching under whatsoever pulling conditions, therefore locations having a temperature near 1100° C. can be precisely detected under any pulling conditions whatsoever.

Figure 5:
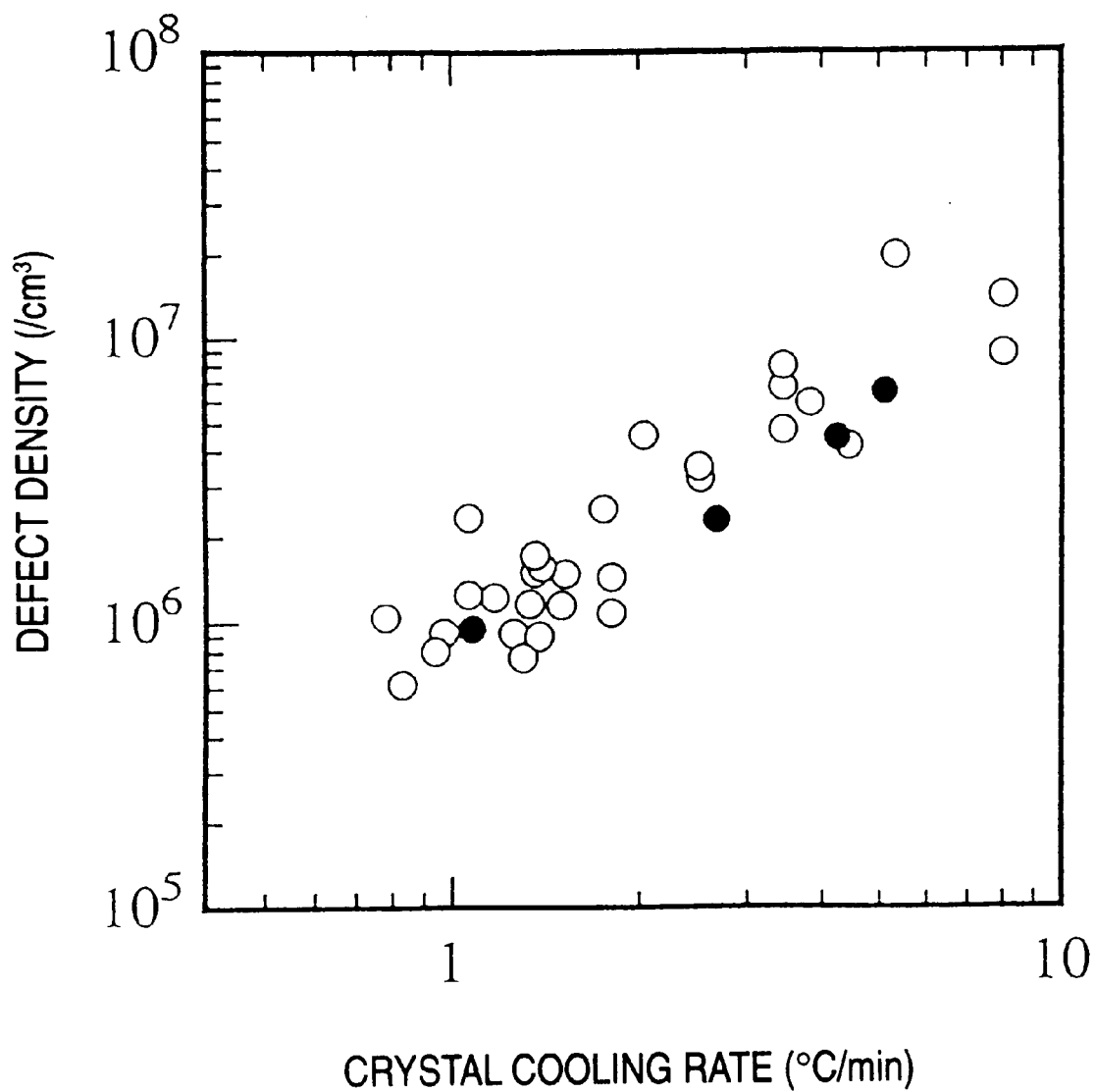
FIG. 5 is an illustration showing the relationship between the crystal cooling rates and the defect densities.

If the locations having a temperature near 1100° C. in silicon single crystals being pulled within each furnace can be found by the above simple method for detecting temperature distributions, then the results can be applied on actual silicon single-crystal manufacturing processes. Namely, the temperature distributions in the crystals can be calculated from the distance between the solid-liquid interface and the locations having a temperature near 1100° C. (the average temperature gradient can be obtained by assuming that the temperature of the liquid surface is 1412° C.). Then, the cooling rate of grown-in defect formation temperature range is obtained by combining the temperature distributions with the pulling speeds. It is possible to control grown-in defects basing on the cooling rate. For example, in order to reduce the density of grown-in defects, the pulling speed is lowered to reduce the cooling rate. FIG. 5 is an illustration showing the relationship between the crystal cooling rates and the defect densities, wherein the vertical axis denotes defect density (/cm$^3$) and the horizontal axis denotes crystal cooling rate (° C./min). As shown in FIG. 5, the defect densities (LSTD densities) in re the cooling rates acquired by this invention and those in re the cooling rates (LSTD densities) acquired by the temperature measured actually by thermal couples can be plotted on the one same line. Therefore, it is obvious that the cooling rates acquired by this invention are correct. In addition, Grown-in defect density strongly relates to the cooling rate. Accordingly, the pulling condition is set by using the temperature gradient obtained according to the present invention to give a desirable cooling rate, so that it is possible to produce a crystal with a desirable crystal defect density. As described above, it is possible to conclude the benefits or the adverse effects toward grown-in defects under various pulling conditions. Accordingly, it is possible to control grown-in defects by appropriately adjusting the pulling conditions.

According to this invention, it is possible to detect temperature distributions in single crystals easily without any alteration to the furnace, and in particular to detect the position at a temperature near 1100° C. where grown-in defects appear in the process of pulling single crystals by the CZ method. In addition, it is possible to control grown-in defects by improving the pulling conditions based on the results detected. In addition, the simple method of this invention can be performed irrelevant to the diameter of the crystal, the pulling speed of the crystal, the cooling rate of the crystal, the oxygen concentration of the crystal. In addition, there is no need to use thermal couples that are expensive and suffer from as yet unresolved difficulties in performing measuring operations, and detection can be performed at low cost.

TABLE 1

Wherein *1: A denotes a heat shield made of graphite only
B denotes a heat shield made of graphite + graphite fibers
*2 denotes old ASTM
*3 denotes the cooling rate required cooling down the detach interface to a temperature below 1100° C.

| No. | Crystal Diameter (in.) | Crystal Length (mm) | Hot Zone Type | Pulling Rate before Detaching (mm/min) | Oxygen concentration (ppma) | Cooling rate (° C./min) | Temperature of AOP Peak Portion in Crystal before Detaching (° C.) |
|---|---|---|---|---|---|---|---|
| 1 | 4 | 450 | A | 1.30 | 25 | 12.5 | 1122.1 |
| 2 | 4 | 450 | A | 0.60 | 25 | 12.5 | 1092.4 |
| 3 | 4 | 450 | B | 1.30 | 25 | 100.9 | 1106.4 |
| 4 | 4 | 450 | B | 1.56 | 25 | 100.9 | 1109 |
| 5 | 6 | 350 | A | 0.70 | 25 | 4.3 | 1076.6 |
| 6 | 6 | 350 | A | 0.70 | 25 | 4.7 | 1085.7 |
| 7 | 6 | 350 | A | 0.70 | 25 | 39.7 | 1090.3 |
| 8 | 6 | 350 | A | 0.70 | 25 | 62.3 | 1094.8 |
| 9 | 6 | 350 | A | 0.70 | 25 | 52 | 1090.3 |
| 10 | 6 | 350 | A | 0.70 | 22 | 52 | 1090.3 |
| 11 | 6 | 350 | A | 0.70 | 28 | 52 | 1090.3 |

What is claimed is:

1. A method for detecting temperature distributions in a single crystal within a furnace of single-crystal manufacturing apparatus by the CZ method, comprising the steps of:

pulling the single crystal to a length at which the beginning of the body of the single crystal is assumed to be at a position sufficiently to have been cooled down to a temperature below 1000° C.;

detaching the single crystal being grown from the molten silicon by pulling it at a speed high enough to detach it from the molten silicon;

performing oxygen precipitation heat-treatment on the detached single crystal to locate the portion of AOP so as to detect the position at which the temperature is 1100° C. in the single crystal immediately before detaching the single crystal from the molten silicon; and thereafter deciding the temperature distributions of the single crystal immediately before detaching it from the molten silicon.

2. A method according to claim 1, wherein the length at which the beginning of the body of the single crystal is assumed to have been cooled down to a temperature below 1000° C. is about more than 300 mm.

3. A method according to claim 1, wherein the speed high enough to detach the single crystal is about more than 10 cm/mm.

4. A method for manufacturing silicon single crystals, in which manufacturing conditions are controlled in a process of manufacturing silicon single crystals by the CZ method, comprising the steps of:

pulling a single crystal to a length at which the beginning of the body of the single crystal is assumed sufficiently to have been cooled down to a temperature below 1000° C.;

detaching the single crystal being grown from the molten silicon by pulling it at a speed high enough to detach it from the molten silicon;

performing oxygen precipitation heat-treatment on the detached single crystal to locate the portion of AOP so as to detect the position at which the temperature is 1100° C. in the single crystal immediately before detaching the single crystal from the molten silicon; and thereafter, calculating the pulling rate based on (1) a crystal cooling rate at 1100° C. capable of controlling the density of Grown-in defect density and (2) a temperature gradient within the crystal calculated by the obtained crystal position at 1100° C., and setting the crystal pulling rate so as to control the density of Grown-in defect.

5. A method according to claim 4, wherein the length at which the beginning of the body of the single crystal is assumed to have been cooled down to a temperature below 1000° C. is about more than 300 mm.

6. A method according to claim 4, wherein the speed high enough to detach the single crystal is about more than 10 cm/mm.

* * * * *